US009680084B2

(12) United States Patent
Ko et al.

(10) Patent No.: US 9,680,084 B2
(45) Date of Patent: Jun. 13, 2017

(54) PIEZOELECTRIC ELEMENT DRIVING APPARATUS AND METHOD, AND PIEZOELECTRIC SYSTEM USING THE SAME

(71) Applicant: SAMSUNG ELECTRO-MECHANICS CO., LTD., Suwon-si (KR)

(72) Inventors: Joo Yul Ko, Suwon-si (KR); Jung Wook Seo, Suwon-si (KR); Ho kwon Yoon, Suwon-si (KR); Hong Yeon Cho, Suwon-si (KR); Boum Seock Kim, Suwon-si (KR); Kang Heon Hur, Suwon-si (KR)

(73) Assignee: MPLUS CO., LTD., Suwon-si, Gyeonggi-Do (KR)

( * ) Notice: Subject to any disclaimer, the term of this patent is extended or adjusted under 35 U.S.C. 154(b) by 208 days.

(21) Appl. No.: 14/246,842

(22) Filed: Apr. 7, 2014

(65) Prior Publication Data
US 2015/0188456 A1    Jul. 2, 2015

(51) Int. Cl.
*H01L 41/04* (2006.01)
*H01L 41/083* (2006.01)
*H02N 2/14* (2006.01)

(52) U.S. Cl.
CPC .......... *H01L 41/083* (2013.01); *H01L 41/042* (2013.01); *B06B 2201/55* (2013.01); *H02N 2/14* (2013.01)

(58) Field of Classification Search
CPC ..... H02N 2/14; H01L 41/042; B06B 2201/55; B06B 1/0253; F02D 41/2096
(Continued)

(56) References Cited

U.S. PATENT DOCUMENTS 5,568,003 A     10/1996  Deck
6,328,399 B1 *  12/2001  Wen ..................... B41J 2/04581
                                                        347/15
(Continued)

FOREIGN PATENT DOCUMENTS

EP     0 958 924     11/1999
EP     2 042 319     4/2009
(Continued)

OTHER PUBLICATIONS

Office Action dated Aug. 17, 2015 for Korean Patent Application No. 10-2013-0166898 and its English translation provided by Applicant's foreign counsel.
(Continued)

*Primary Examiner* — Kawing Chan
*Assistant Examiner* — Bradley Brown
(74) *Attorney, Agent, or Firm* — LRK Patent Law Firm

(57) ABSTRACT

A piezoelectric element driving apparatus may apply a predetermined driving signal to a piezoelectric element to drive the piezoelectric element. The driving signal may be an asymmetrical waveform in which amplitudes of first and second polarities thereof are different from each other. An exemplary embodiment in the present disclosure may provide a piezoelectric element driving apparatus and method having a high output while protecting dielectric characteristics of a piezoelectric element by driving the piezoelectric element using an asymmetrical driving signal.

37 Claims, 12 Drawing Sheets

(58) Field of Classification Search
USPC .......................................................... 316/116
See application file for complete search history.

(56) References Cited

U.S. PATENT DOCUMENTS

| | | | |
|---|---|---|---|
| 2004/0124743 A1 | 7/2004 | Pease et al. | |
| 2004/0164646 A1* | 8/2004 | Fujinawa | H02N 2/062 310/317 |
| 2009/0085983 A1* | 4/2009 | Simons | B41J 2/04541 347/68 |
| 2011/0097100 A1* | 4/2011 | Nagasaki | G03G 15/80 399/88 |

FOREIGN PATENT DOCUMENTS

| | | |
|---|---|---|
| JP | 08-340681 | 12/1996 |
| JP | 11195961 A | 7/1999 |
| JP | 2003-319669 | 11/2003 |
| JP | 2010-136545 | 6/2010 |
| JP | 2010136545 A * | 6/2010 |
| KR | 102000010526 A | 2/2000 |
| KR | 1020130117034 A | 10/2013 |

OTHER PUBLICATIONS

Extended European Search Report dated Jun. 15, 2015 for European Patent Application No. 14162946.9.

KIPO Office Action for Korean Patent Application No. 10-2013-0166898 which corresponds to the above-referenced U.S application.

Timothy D. Usher et al., "Piezoelectric Microfiber Composite Actuators for Morphing Wings", ISRN Materials Science, vol. 2013, Article ID 189659, Hindawi Publishing Corporation, Dec. 22, 2012.

Micheal Karpelson et al., "Driving high voltage piezoelectric actuators in microrobotic application", Sensors and Actuators A: Phys., 2012.

Scott Jordan et al., "Long-Travel Piezomotors: New Innovations, New Solutions", Feb. 7, 2012.

KIPO Notice of Allowance for Korean Patent Application No. 10-2013-0166898 which corresponds to the above-referenced U.S. application.

* cited by examiner

PIEZOELECTRIC ELEMENT DRIVING APPARATUS AND METHOD, AND PIEZOELECTRIC SYSTEM USING THE SAME

CROSS-REFERENCE TO RELATED APPLICATION

This application claims the benefit of Korean Patent Application No. 10-2013-0166898 filed on Dec. 30, 2013, with the Korean Intellectual Property Office, the disclosure of which is incorporated in its entirety herein by reference.

BACKGROUND

The present disclosure relates to a piezoelectric element driving apparatus and method allowing for high output while protecting dielectric characteristics of the piezoelectric element using an asymmetrical driving signal, and a piezoelectric system using the same.

In accordance with an increase in interest in user interfaces and the development of user interface-related technology, a user data input reaction technology has become an importable element in user interfaces in terminals.

Initial reaction technology has been used to provide simple vibrations in response to user data input to allow a user to confirm data input.

Recently, as it has been important to provide more precise reactions or vibrations to user data inputs. In order to address this issue, a technical transition from touch reaction technology, according to the related art, based on motor driving technology, to haptic technology capable of providing various reaction elements has been made.

Haptic technology generally indicates an overall system transferring tactile sensations to a user. In haptic technology, a predetermined vibration element may be vibrated to transfer physical impulses to a user, thereby providing the user with tactile sensations. Recently, it the provision of various reactions in order to provide user feedback, based on greater precision in controlling has been demanded.

In such haptic technology, the provision of various vibration patterns using various frequencies has been demanded. In order to satisfy this demand, a piezoelectric actuator formed of ceramic has been used in recent times. Such a piezoelectric actuator has a faster response speed, a reduced amount of noise, and a higher resonance bandwidth as compared with existing linear resonance actuators or existing vibration motors containing magnets.

An initial piezoelectric actuator is formed of a single piezoelectric layer, such that it requires a voltage exceeding 100V as a driving voltage for the driving thereof. Therefore, in a mobile terminal such as a smartphone, significant amounts of power are consumed due to the driving of the piezoelectric actuator formed of the single piezoelectric layer.

In order to solve this problem, a piezoelectric element formed of a plurality of piezoelectric layers has been used. However, a piezoelectric element formed of the plurality of piezoelectric layers has a limited range of driving voltages. Particularly, in the case in which a driving voltage of a negative electrode, among such driving voltages, is strongly applied, the disposition of electrical charges in dielectric portions of the piezoelectric element is affected, such that piezoelectric characteristics of the dielectric are lost. Therefore, a piezoelectric element formed of the plurality of piezoelectric layers has a very limited operating voltage. In addition, due to the limitation of the operating voltage, output characteristics of the piezoelectric element may be reduced.

SUMMARY

An exemplary embodiment in the present disclosure may provide a piezoelectric element driving apparatus and method having a high output while protecting dielectric characteristics of a piezoelectric element by driving the piezoelectric element using an asymmetrical driving signal, and a piezoelectric system using the same.

According to an exemplary embodiment in the present disclosure, a piezoelectric element driving apparatus may apply a predetermined driving signal to a piezoelectric element to drive the piezoelectric element, wherein the driving signal is an asymmetrical waveform in which amplitudes of first and second polarities thereof are different from each other.

According to an exemplary embodiment in the present disclosure, a piezoelectric element driving apparatus may generate a pair of waveforms and apply the pair of waveforms to both terminals of a piezoelectric element, respectively, wherein the pair of waveforms include: a first symmetrical waveform of which amplitudes of first and second polarities are the same as each other; and a second asymmetrical waveform of which amplitudes of first and second polarities are different from each other.

According to another aspect of the present disclosure, a piezoelectric element driving apparatus may generate a pair of sine waves and apply the pair of sine waves to both terminals of a piezoelectric element, respectively, wherein the pair of sine waves include: a first asymmetrical sine wave of which amplitudes of first and second polarities are different from each other; and a second asymmetrical sine wave of which amplitudes of first and second polarities are different from each other.

According to an exemplary embodiment in the present disclosure, a piezoelectric element driving apparatus may include: a waveform synthesizing unit outputting first and second digital signals for generating a driving signal; a digital-to-analog converting unit outputting first and second analog signals corresponding to the first and second digital signals, respectively; and an amplifying unit amplifying the first and second analog signals and providing the amplified first and second analog signals to a piezoelectric element, wherein the driving signal is an asymmetrical sine wave in which amplitudes of first and second polarities thereof are different from each other.

According to an exemplary embodiment in the present disclosure, a piezoelectric element driving method may include: generating first and second digital signals using a preset lookup table; generating first and second analog signals corresponding to the first and second digital signals, respectively; and generating an asymmetrical driving signal of which amplitudes of first and second polarities are different from each other by amplifying the first and second analog signals.

Further, in summary, all of the features of the present disclosure are not described. Various features of the present disclosure and advantages and effects depending on various features may be understood in more detail with reference to the following detailed description.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
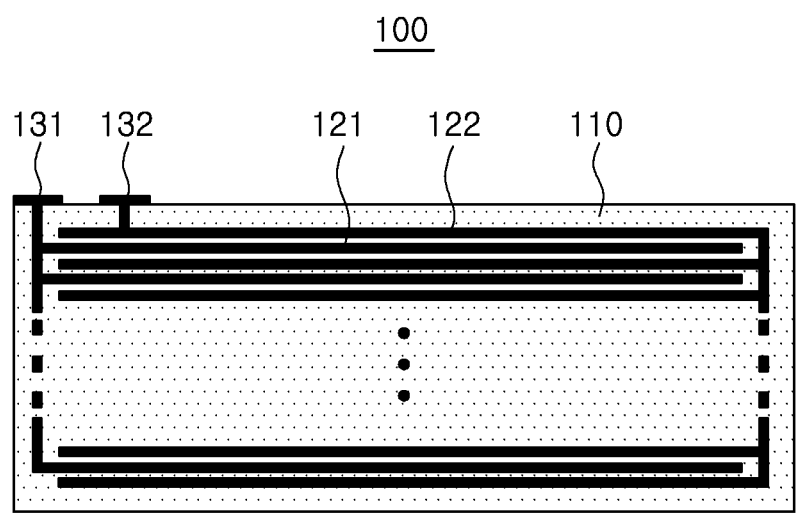
FIG. 1 is a cross-sectional view of a general multilayer piezoelectric element.

Hereinafter, embodiments of the present disclosure will be described in detail with reference to the accompanying drawings. The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art. In the drawings, the shapes and dimensions of elements may be exaggerated for clarity, and the same reference numerals will be used throughout to designate the same or like elements.

FIG. 1 is a cross-sectional view of a general multilayer piezoelectric element.

As shown in FIG. 1, a multilayer piezoelectric element 100 according to an exemplary embodiment of the present disclosure may be formed of a multilayer body in which a plurality of piezoelectric layers 110 are stacked and may include internal electrodes 121 and 122 alternately stacked on the plurality of piezoelectric layers 110. Here, positive internal electrodes 121 and positive internal electrodes 122 may be alternately disposed on the plurality of piezoelectric layers 110.

The plurality of piezoelectric layers 110 may be formed of ceramic and be manufactured in a planar ceramic sheet form using particulate ceramic powders. A plurality of ceramic sheets may be stacked to configure the piezoelectric layers 110, respectively, and the piezoelectric layers 110 may configure the multilayer body and generate displacement in a length direction or an end surface direction by a voltage applied thereto. Here, a voltage applied to the multilayer body in which the piezoelectric layers 110 are stacked may be applied through the internal electrodes 121 and 122 formed on the piezoelectric layers 110.

The internal electrodes 121 and 122 may be formed of a metal having excellent conductivity and may be mainly formed of an alloy of Ag and Pd. The internal electrodes 121 and 122 may form a positive electrode and a negative element, respectively, in the multilayer body in which the plurality of piezoelectric layers 110 are stacked, and the internal electrodes 121 and 122 may be alternately stacked repeated on the piezoelectric layers 110 to configure the piezoelectric element having a polarity.

In addition, the internal electrodes 121 and 122, disposed between the piezoelectric layers 110 and having the same polarities, may be electrically connected to each other while forming alternately the positive electrode and the negative electrode, and the internal electrodes 121 and 122 having the respective polarities may be electrically connected to a positive electrode terminal 131 and a negative electrode terminal 132 exposed to one surface of the multilayer body through lead wires, respectively.

Therefore, the piezoelectric element 110 may receive driving signals applied from a piezoelectric element driving apparatus through the positive electrode terminal 131 and the negative electrode terminal 132.

Since the multilayer piezoelectric element 110 has a driving voltage relatively smaller than that of a single type piezoelectric element, it may generate the same output as that of the single type piezoelectric element while consuming power smaller than that of the single type piezoelectric element. Therefore, it has been popularized to use the multilayer piezoelectric element 110 in a field in which power management is important such as a mobile device, or the like.

Figure 2:
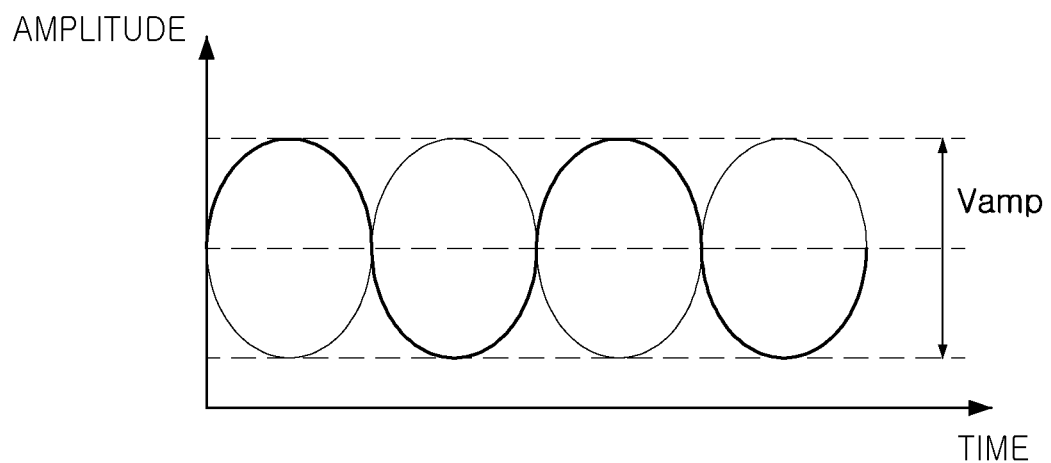
FIG. 2 is a graph illustrating a general example of driving signals applied to both terminals of the piezoelectric element.
Figure 3:
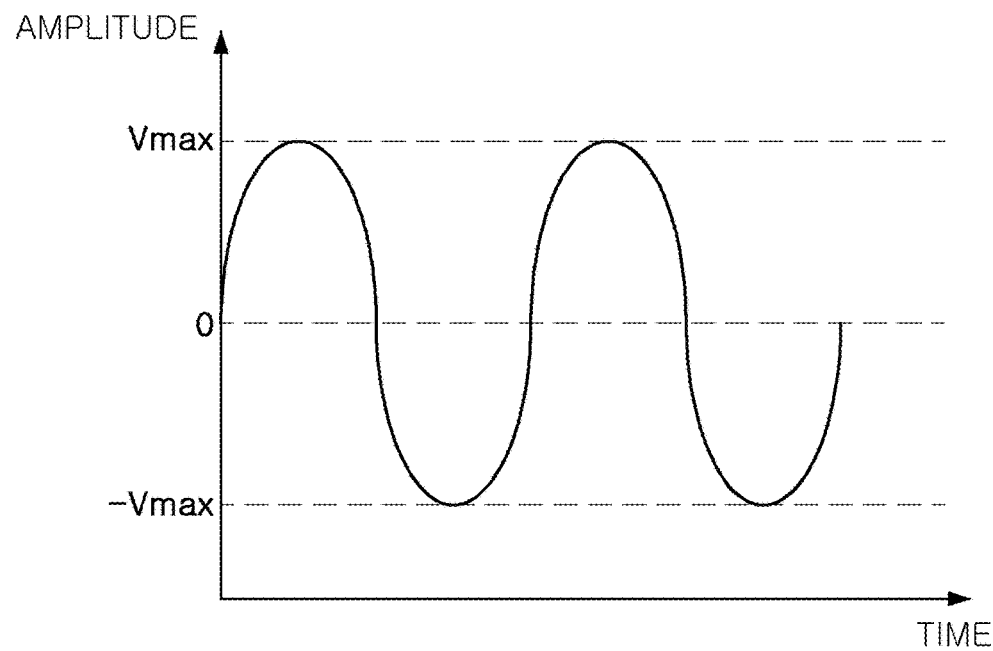
FIG. 3 is a graph illustrating the driving signals of FIG. 2 as a single driving signal.

FIG. 2 is a graph illustrating a general example of driving signals applied to both terminals of the piezoelectric element; and FIG. 3 is a graph illustrating the driving signals of FIG. 2 as a single driving signal.

The graph of FIG. 2 shows a pair of sine wave driving signals having a phase difference of 180 degrees or less. The pair of driving signals may be input to both terminals of the piezoelectric element, respectively. For example, a first sine wave denoted by red may be input to a positive electrode terminal of the piezoelectric element, and a second sine wave denoted by blue may be input to a negative electrode terminal of the piezoelectric element.

In addition, as shown in FIG. 2, the general driving signals have a feature in which amplitudes thereof are symmetrical with respect to each other. That is, a negative amplitude and a positive amplitude of the driving signals shown in FIG. 2 may be the same as each other. FIG. 3 is a graph illustrating the driving signals of FIG. 2 as a single driving signal. In detail, FIG. 3 shows a driving signal obtained by subtracting the second sine wave from the first sine wave of FIG. 2.

In addition, the sine wave shown in FIG. 3 may become a driving signal input to the piezoelectric element. That is, FIG. 2 shows the driving signals input to both terminals of the piezoelectric element, respectively, and FIG. 3 shows the driving signal applied to the piezoelectric element by the driving signals applied to both terminals of the piezoelectric element.

As described above, it may be appreciated that the driving signal applied to the piezoelectric element has a symmetrical form.

As described above with reference to FIGS. 2 and 3, a symmetrical driving signal may be generally used in order to drive the piezoelectric element. However, in this case, a magnitude, that is, a voltage value, of the applied driving signal needs to have a limited magnitude.

Figure 4:
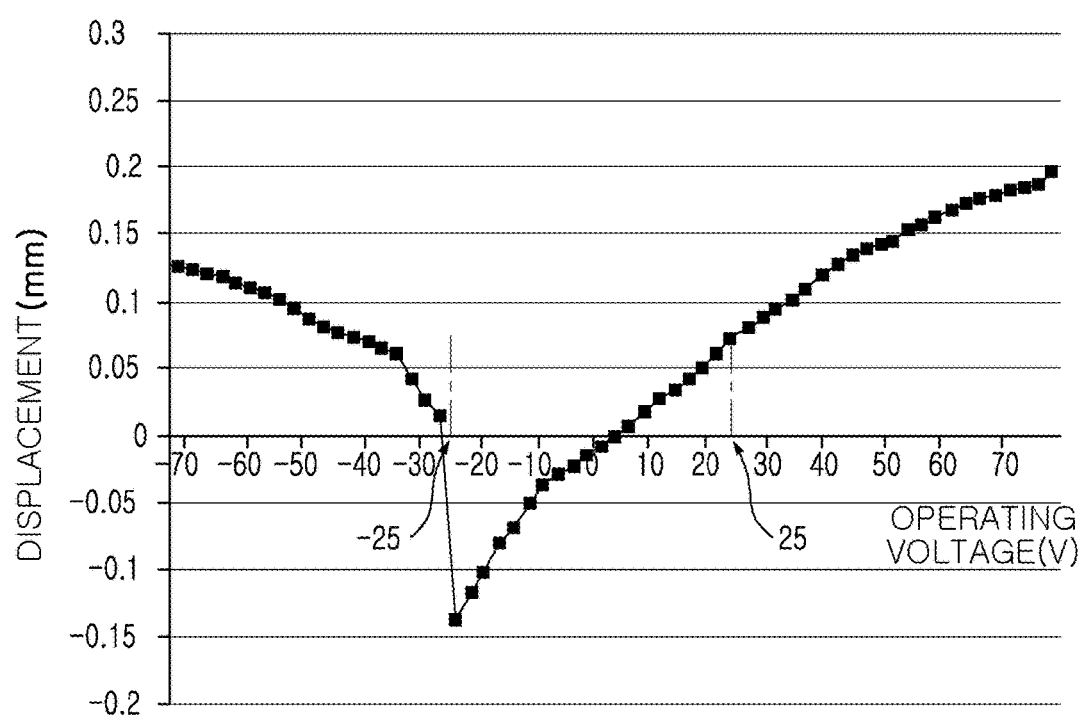
FIG. 4 is a graph illustrating an example of displacement of an operating voltage of the driving signal of the piezoelectric element.

FIG. 4 is a graph illustrating an example of displacement of an operating voltage of the driving signal of the piezoelectric element. Hereinafter, a detailed description will be provided with reference to FIG. 4. FIG. 4 shows an example of a multilayer piezoelectric element having twelve piezoelectric layers.

As shown in FIG. 4, it may be appreciated that in the case in which a driving voltage has a positive value, displacement is increased in proportion to a magnitude of an applied driving voltage. On the other hand, it may be appreciated that in the case in which the driving voltage has a negative value, when a voltage below a predetermined threshold value, for example, −25V in the example shown in FIG. 4, is applied, displacement of the piezoelectric element is rapidly changed from a negative value to a positive value. This phenomenon may occur since a voltage having a reverse polarity is strongly imparted to the piezoelectric element to depolarize the piezoelectric element.

That is, in the case in which a driving voltage in a negative direction is strongly applied to the piezoelectric element, charges polarized in the piezoelectric element are depolarized, such that piezoelectric characteristics are lost.

Figure 5:
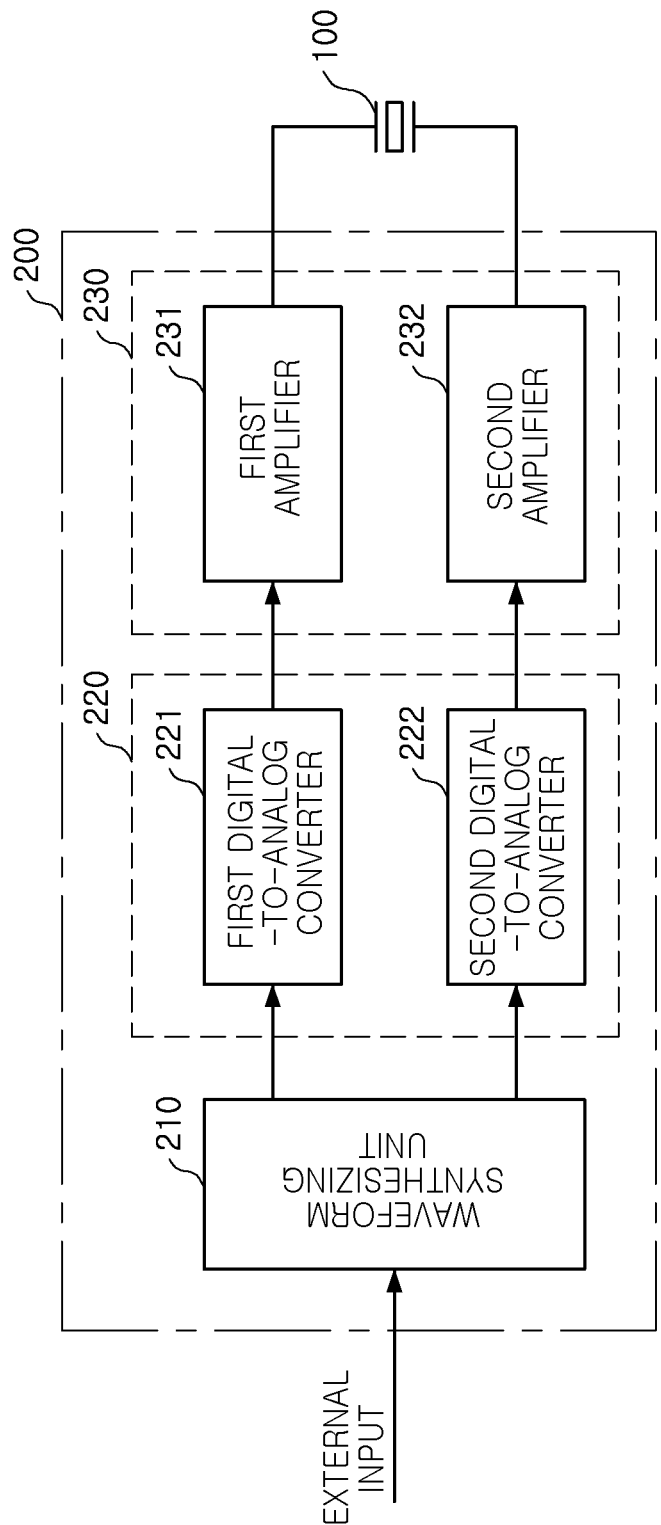
FIG. 5 is a configuration diagram illustrating a piezoelectric element driving apparatus according to an exemplary embodiment of the present disclosure.

Therefore, only a voltage larger than a negative threshold value of the driving voltage, for example, −25V in the example shown in FIG. 5, needs to be used as the driving voltage. Therefore, a positive threshold value of the driving voltage is also limited to +25V. The reason is that a positive magnitude and a negative magnitude of the driving voltage should correspond to each other, as described above with reference to FIGS. 2 and 3.

As a result, the driving voltage of the piezoelectric element is limited to a range of −25V to +25V. This may be varied depending on the number of stacked layers in the piezoelectric element. However, as the number of stacked layers in the piezoelectric element is increased, the negative threshold value of the driving voltage at which the piezoelectric element is depolarized is increased, such that a range of the driving voltage becomes smaller.

Therefore, due to the above-mentioned problem, only a portion of a positive range of a driving voltage of a general piezoelectric element is used. That is, in the example shown in FIG. 4, although the piezoelectric element has the piezoelectric characteristics even at a voltage of +25V or more, only a voltage up to +25V is used due to the negative threshold value of the driving voltage at which the piezoelectric element is depolarized. Due to this limitation, an absolute range of the driving voltage of the piezoelectric element is relatively small, such that there is a limitation in an output of the piezoelectric element.

In order to solve this limitation, a piezoelectric element driving technology according to an exemplary embodiment of the present disclosure will be described below together with various examples.

In a piezoelectric element driving technology according to an exemplary embodiment of the present disclosure to be described below, an asymmetrical waveform may be applied as a driving signal to a piezoelectric element to satisfy a negative threshold value of the piezoelectric element, thereby providing a high output while maintaining characteristics of the piezoelectric element. At least half of a period of the applied asymmetrical waveform may be a sine wave.

For example, the piezoelectric element may be formed by stacking eight to twenty four piezoelectric layers, each of which has a thickness of 15 or more to 100 μm or less. In this case, the piezoelectric element may have the negative threshold value as described above. Therefore, in an exemplary embodiment of the present disclosure, a driving voltage having a magnitude larger than a negative threshold value with respect to a positive polarity while satisfying the negative threshold value may be applied to the piezoelectric element to drive the piezoelectric element, thereby providing the high output while protecting the characteristics of the piezoelectric element. For example, when it is assumed that a negative threshold value at which the characteristics of the piezoelectric element are lost is −25V, the driving signal may have a voltage larger than −25V as an amplitude of a negative polarity. Meanwhile, the driving signal may have a value below 35V as an amplitude of a positive polarity. That is, since the characteristics of the piezoelectric element are lost in the case in which a signal smaller than the negative threshold value is applied to the piezoelectric element, the asymmetrical driving signal satisfying the negative threshold value and having a positive signal larger than the negative threshold value may be used, thereby performing stronger driving while satisfying the negative threshold value.

The following Table 1 shows the number of piezoelectric layers of a piezoelectric element and amplitudes of driving signals depending on the number of piezoelectric layers. In Table 1, a thickness of the piezoelectric layer may be 10 to 100 μm.

TABLE 1

| Number of Piezoelectric Layer | Negative Minimum Amplitude | Positive Maximum Amplitude |
| --- | --- | --- |
| 12 | −25 | 35 |
| 24 | −12.5 | 17.5 |

In an exemplary embodiment of the present disclosure, the piezoelectric element may be formed by stacking twelve piezoelectric layers, an amplitude of a positive polarity of the driving signal may be smaller than 35V, and an amplitude of a negative polarity may be smaller than −25V.

In another exemplary embodiment of the present disclosure, the piezoelectric element may be formed by stacking twenty four piezoelectric layers, an amplitude of a positive polarity of the driving signal may be smaller than 18V, and an amplitude of a negative polarity may be smaller than −12V.

In an exemplary embodiment of the present disclosure, a piezoelectric system may include a piezoelectric element driving apparatus and a piezoelectric element. The piezoelectric element driving apparatus may output a first asymmetrical waveform of which amplitudes of first and second polarities are different from each other and a second asymmetrical waveform of which amplitudes of first and second polarities are different from each other. The piezoelectric element may receive the first asymmetrical waveform through a first terminal thereof and receive the second asymmetrical waveform through a second terminal thereof to thereby vibrate.

Hereinafter, various examples of a piezoelectric element driving apparatus according to an exemplary embodiment of the present disclosure will be described in more detail with reference to FIGS. 5 through 8.

FIG. 5 is a configuration diagram illustrating a piezoelectric element driving apparatus according to an exemplary embodiment of the present disclosure.

A piezoelectric element driving apparatus 200 may apply a predetermined driving signal to a piezoelectric element 100 to drive the piezoelectric element 100. That is, the piezoelectric element driving apparatus 200 may provide a pair of waveforms to both terminals of the piezoelectric element 100, respectively, to apply the driving signal. Here, the driving signal applied to the piezoelectric element 100 may be an asymmetrical signal.

In an exemplary embodiment of the present disclosure, the driving signal may be a waveform in which maximum amplitudes of first and second polarities thereof are different from each other.

In an exemplary embodiment of the present disclosure, the driving signal may be an asymmetrical waveform in which amplitudes of first and second polarities thereof are different from each other.

In an exemplary embodiment of the present disclosure, at least half of a period of the driving signal may be a sine wave.

The piezoelectric element driving apparatus 200 may include a waveform synthesizing unit 210, a digital-to-analog converting unit 220, and an amplifying unit 230.

The waveform synthesizing unit 210 may receive an external input and may output a predetermined digital value (hereinafter, referred to as a digital signal) for generating a driving signal depending on the external input. The external input, which is a signal input from the outside of the piezoelectric element driving apparatus, may be provided from, for example, a main central processing unit (CPU), a control integrated circuit (IC), a micro controller unit (MCU), or the like, of a mobile device including the piezoelectric element driving apparatus.

In an exemplary embodiment of the present disclosure, the waveform synthesizing unit 110 may output at least some of digital values included in a preset lookup table. In another exemplary embodiment of the present disclosure, the waveform synthesizing unit 110 may output predetermined digital values using a function of outputting the digital values depending on the external input. Here, the function may apply a preset equation to the external input to output the digital values.

The waveform synthesizing unit 210 may output first and second digital signals in order to generate the driving signal. Since the driving signal includes a pair of waveforms applied to a positive electrode terminal and a negative electrode terminal of the piezoelectric element 100, respectively, the waveform synthesizing unit 210 may output the first and second digital signals for generating the pair of waveforms.

Figure 6:
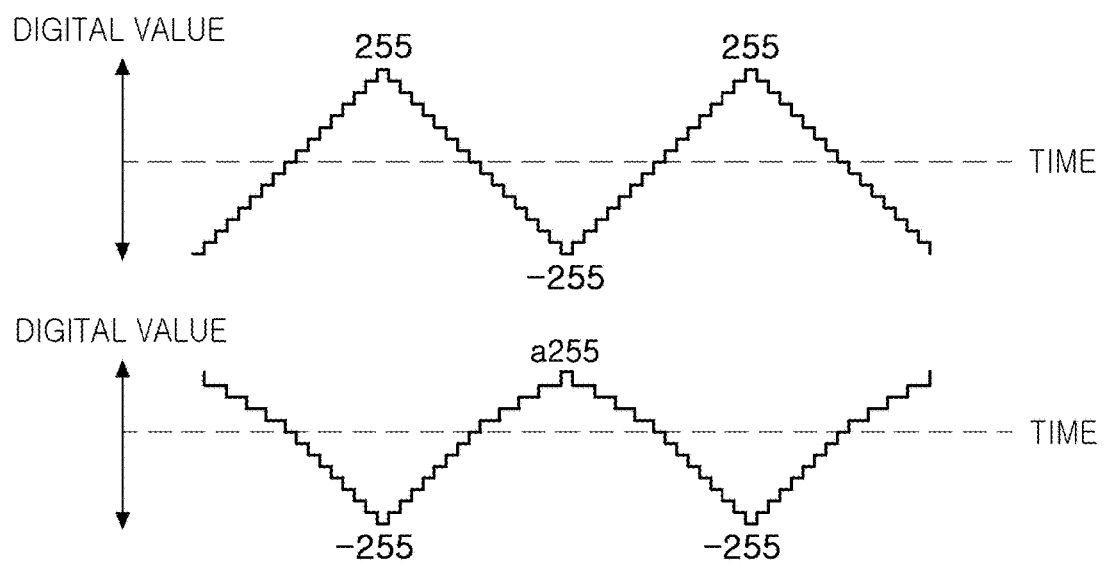
FIG. 6 is a graph illustrating an example of a signal output from a waveform synthesizing unit of FIG. 5.

In an exemplary embodiment of the present disclosure, the first and second digital signals output from the waveform synthesizing unit 210 may have a phase difference of 180 degrees or less therebetween. For example, since the waveform synthesizing unit 210 should generate a pair of differential signals in order to drive the piezoelectric element 100, the waveform synthesizing unit 210 may select digital values for generating the pair of differential signals from a lookup table to output a pair of digital signals. In an exemplary embodiment of the present disclosure, the waveform synthesizing unit 210 may apply an asymmetrical coefficient to at least one of the first and second digital signals in order to generate an asymmetrical driving signal. FIG. 6 is a graph illustrating an example of a signal output from a waveform synthesizing unit of FIG. 5. An example of the waveform synthesizing unit 210 will be described with reference to FIGS. 5 and 6.

As shown in FIG. 6, the first and second digital signals output from the waveform synthesizing unit 210 may have a phase difference of 180 degrees or less therebetween, but may have amplitudes that are not as least partially the same as each other.

That is, the first digital signal shown at an upper portion of FIG. 6 may be a symmetrical signal in which amplitudes of first and second polarities thereof are the same as each other, and the second digital signal shown at a lower portion of FIG. 6 may be an asymmetrical signal in which amplitudes of first and second polarities thereof are different from each other.

To this end, the waveform synthesizing unit 210 may generate the first digital signal using a plurality of digital values included in a preset lookup table and may apply a preset asymmetrical coefficient a to at least some of the plurality of digital values to generate the second digital signal. Therefore, in the example shown in FIG. 6, a positive maximum value of the first digital signal may be 255, while a positive maximum value of the second digital signal may be a255. Meanwhile, it may be appreciated that negative maximum values of the first and second digital signals are the same as each other, that is, −255.

That is, since the first digital signal has a symmetrical waveform, the waveform synthesizing unit 210 may output data in the lookup table without performing any processing on the data to generate the first digital signal, but may apply the asymmetrical coefficient a to a digital value corresponding to the first polarity, that is, a positive polarity in the example shown in FIG. 6, in the second digital signal.

The waveform synthesizing unit 210 may provide the first and second digital signals generated as described above to the digital-to-analog converting unit 220.

This will be described in more detail with reference to FIG. 5. First and second digital-to-analog converters 221 and 222 may receive the first and second digital signals output from the waveform synthesizing unit 210, respectively, and convert the first and second digital signals into analog signals, respectively. Outputs of the first and second digital-to-analog converters 221 and 222 may be input into first and second amplifiers 231 and 231, respectively, and be then input to both terminals of the piezoelectric element 100, respectively.

Figure 7:
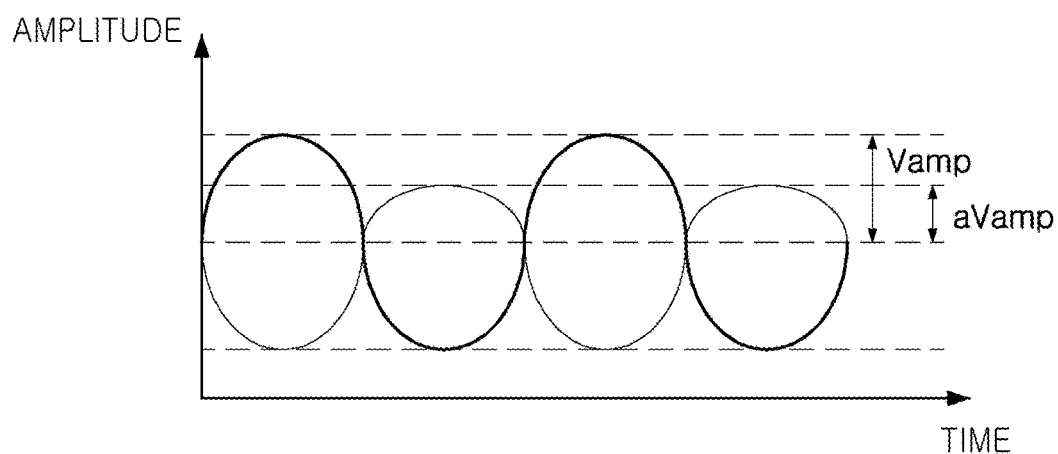
FIG. 7 is a graph illustrating an analog signal generated from a digital signal of FIG. 6.

FIG. 7 is a graph illustrating an analog signal generated from a digital signal of FIG. 6. In FIG. 7, first and second analog signals having a phase difference of 180 degrees or less therebetween is shown. In FIG. 7, the first analog signal is denoted by a thick line, and the second analog signal is denoted by a solid line.

In addition, it may be appreciated that the asymmetrical coefficient a has been applied to values having a positive polarity in the second analog signal denoted by the solid line. That is, a positive maximum value aVamp of the second analog signal is generated by applying the asymmetrical coefficient a to a positive maximum value Vamp of the first analog signal. Therefore, it may be appreciated that the second analog signal is asymmetrical since a value of a positive polarity thereof is smaller than that of a negative polarity thereof.

The first analog signal may be applied to a positive terminal of the piezoelectric element, and the second analog signal that is asymmetrical may be applied to a negative terminal of the piezoelectric element.

Figure 8:
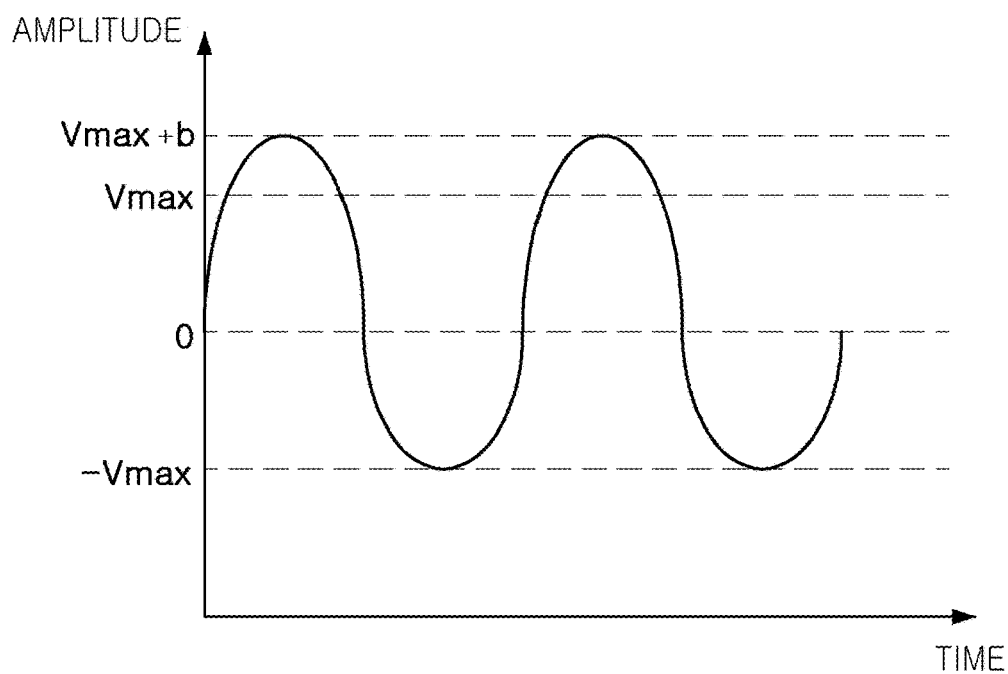
FIG. 8 is a graph illustrating a driving signal applied to a piezoelectric element by a pair of analog signals of FIG. 7.

FIG. 8 is a graph illustrating a driving signal applied to a piezoelectric element by a pair of analog signals of FIG. 7. That is, in the case in which a pair of analog signals are input to the positive and negative terminals of the piezoelectric element, respectively, the piezoelectric element may receive the driving signal of FIG. 8 applied thereto.

In detail, when the second analog signal, which is the asymmetrical signal, denoted by the solid line in FIG. 7 is subtracted from the first analog signal denoted by the thick line in FIG. 7, the driving signal of FIG. 8 may be derived.

It may be appreciated that an amplitude of a positive polarity of the driving signal shown in FIG. 8 is larger than that of a negative polarity thereof. That is, it may be appreciated that a negative maximum value is −Vmax, while a positive maximum value is larger than an absolute value of −Vmax by b. Here, b corresponds to the above-mentioned asymmetrical coefficient.

In addition, as described above with reference to FIG. 4, the piezoelectric element 100 has a feature that a threshold value is present in a negative voltage, while a separate threshold value is not present in a positive polarity. Therefore, in an exemplary embodiment of the present disclosure, an asymmetrical signal as shown in FIG. 8, that is, a voltage higher than an absolute value of the negative threshold value with respect to a positive polarity while satisfying the negative threshold value may be applied, such that a stronger driving signal may be applied without losing characteristics of the piezoelectric element 100.

Hereinabove, the example of generating the asymmetrical driving signal by outputting the asymmetrical digital signal from the waveform synthesizing unit 210 has been described. Hereinafter, an example of generating an asymmetrical driving signal through weighted digital-to-analog conversion will be described with reference to FIGS. 9 through 13.

Figure 9:
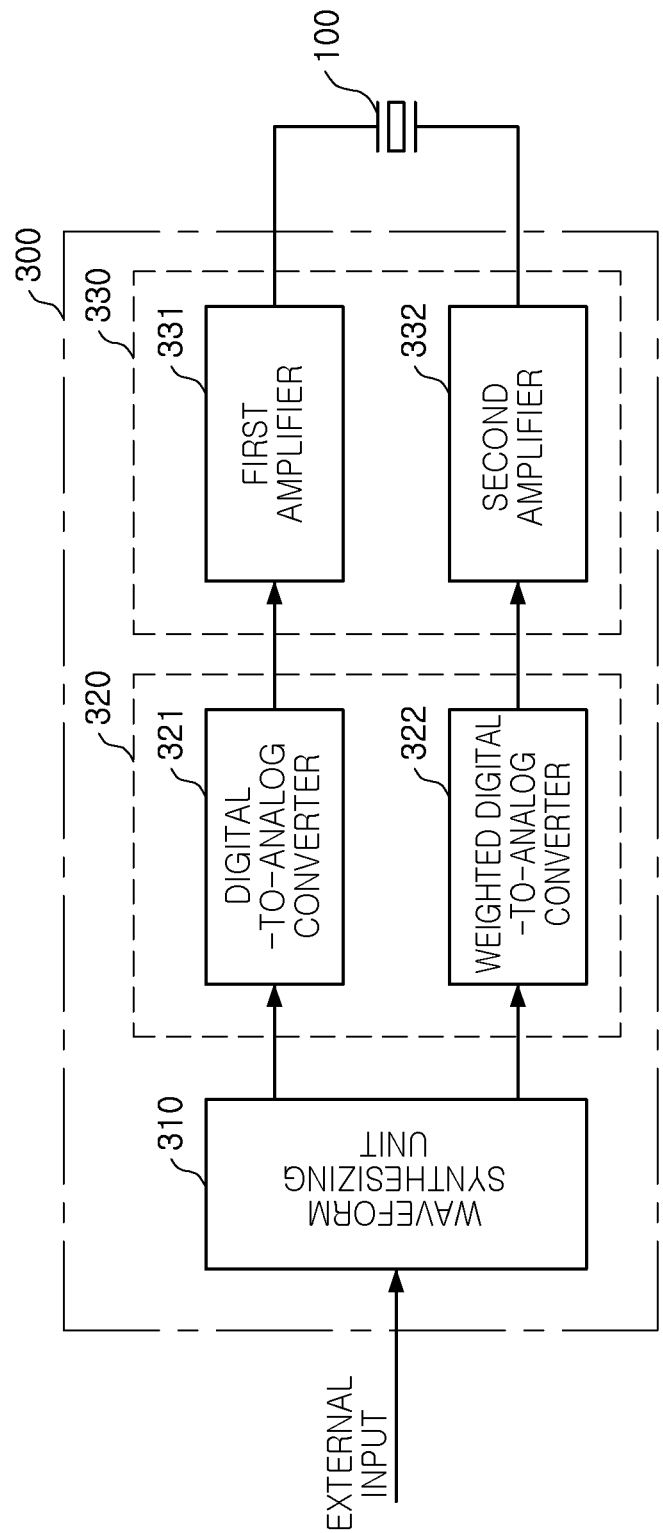
FIG. 9 is a configuration diagram illustrating a piezoelectric element driving apparatus according to another exemplary embodiment of the present disclosure.

FIG. 9 is a configuration diagram illustrating a piezoelectric element driving apparatus 300 according to another exemplary embodiment of the present disclosure.

The piezoelectric element driving apparatus 300 may include a waveform synthesizing unit 310, a weighted digital-to-analog converting unit 320, and an amplifying unit 330.

Figure 10:
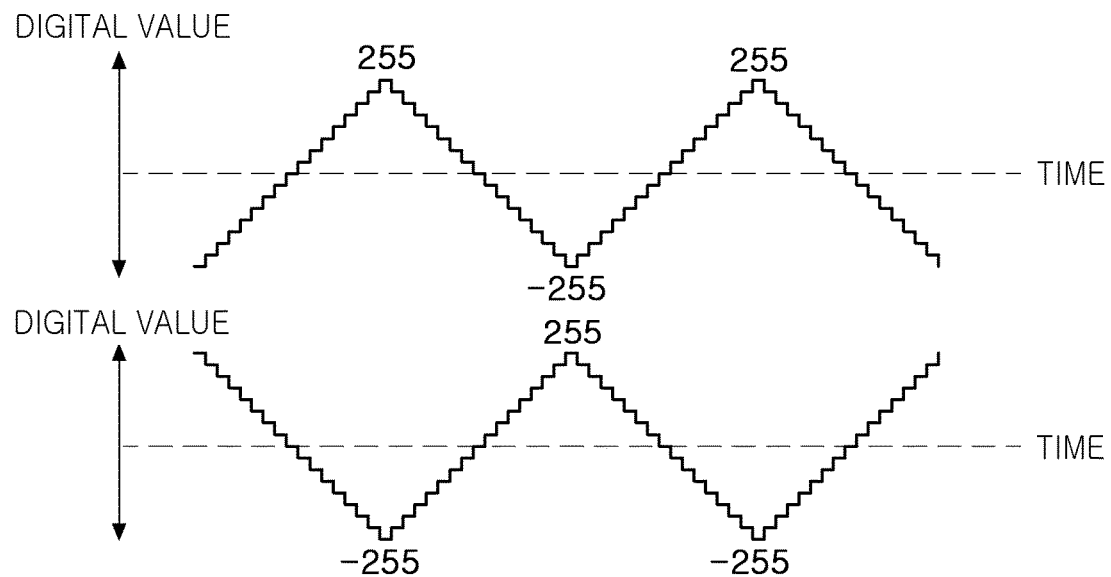
FIG. 10 is a graph illustrating an example of an output of a waveform synthesizing unit of FIG. 9.

The waveform synthesizing unit 210 may receive an external input and may output a predetermined digital signal for generating a driving signal depending on the external input. The waveform synthesizing unit 210 may output a pair of digital signals having a phase difference of 180 degrees or less therebetween. An example of an output of the waveform synthesizing unit 210 is shown in FIG. 10.

The weighted digital-to-analog converting unit 320 may receive the pair of digital signals and apply an asymmetrical coefficient to at least one of the pair of digital signals to output an analog signal.

That is, the weighted digital-to-analog converting unit 320 may include a weighted digital-to-analog converter 322 assigning a weight to at least one of first and second digital signals to generate an asymmetrical sine wave.

Figure 11:
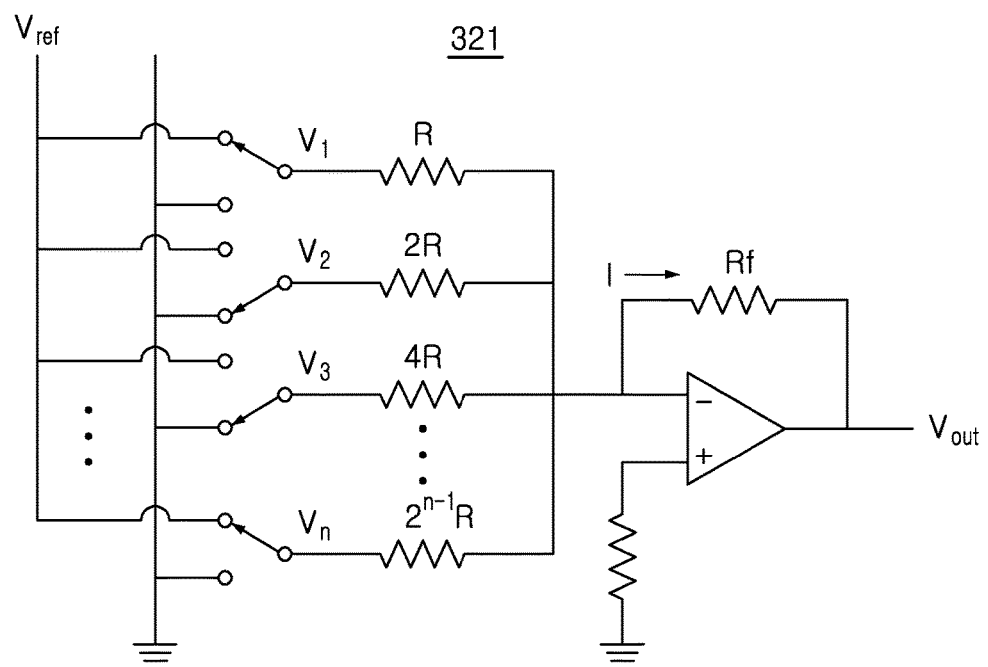
FIG. 11 is a circuit diagram illustrating an example of a digital-to-analog converter of FIG. 9.
Figure 12:
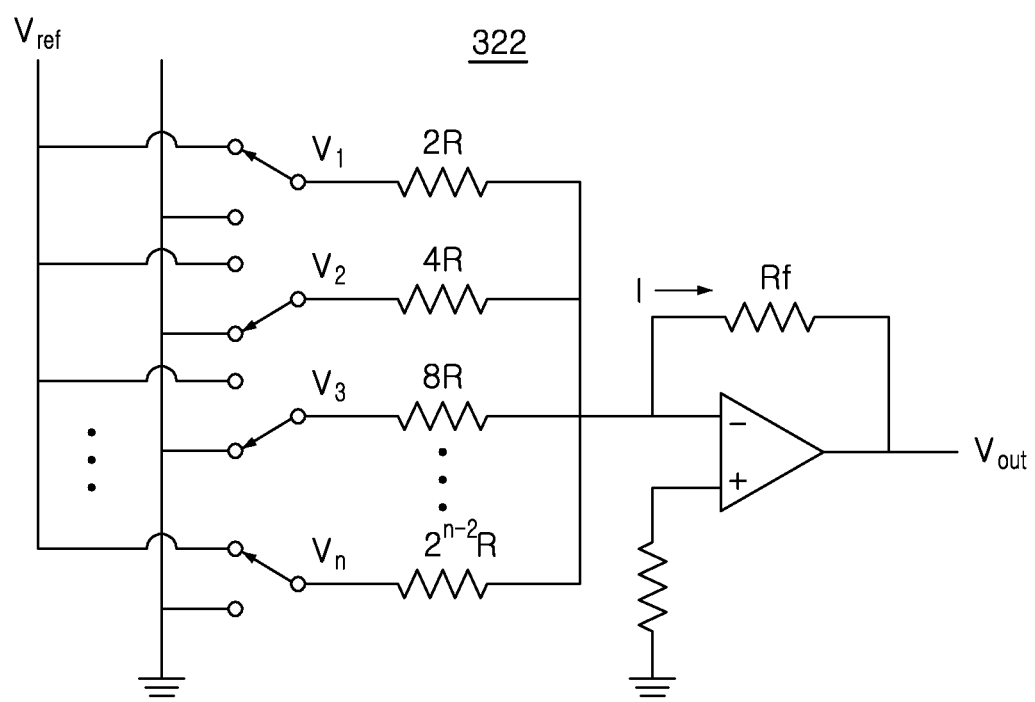
FIG. 12 is a circuit diagram illustrating an example of a weighted digital-to-analog converter of FIG. 9.

In an exemplary embodiment of the present disclosure, the weighted digital-to-analog converting unit 320 may include a digital-to-analog converter 321 and the weighted digital-to-analog converter 322. FIG. 11 is a circuit diagram illustrating an example of a digital-to-analog converter 321 of FIG. 9; and FIG. 12 is a circuit diagram illustrating an example of a weighted digital-to-analog converter 322 of FIG. 9.

First referring to FIG. 11, the digital-to-analog converter 321 may convert the received digital signal into an analog signal and then output the analog signal. The digital-to-analog converter 321 may output the analog signal having symmetry.

The digital-to-analog converter 321 may perform a switching operation depending on the received digital signal. A resistance value is selected by the switching operation, such that a magnitude of the output analog signal may be changed. The output of the digital-to-analog converter 321 may be represented by Mathematical Equation 1.

$$V_{out} = -IR_f = -R_f\left(\frac{V_1}{R} + \frac{V_2}{2R} + \frac{V_3}{4R} + \ldots \frac{V_n}{2^{n-1}R}\right)$$ [Mathematical Equation 1]

Meanwhile, the weighted digital-to-analog converter 322 may apply the asymmetrical coefficient to the received digital signal to output an asymmetrical analog signal. The asymmetrical coefficient may be reflected in a resistor of the weighted digital-to-analog converter 322.

Referring to the example of FIG. 12, the weighted digital-to-analog converter 322 may use a weighted resistor. In the weighted digital-to-analog converter 322, a resistor connected to the least significant bit (LSB) may have a value corresponding to 1/n of a resistance value of the digital-to-analog converter 321, and a resistor connected to the most significant bit (MSB) may have a value corresponding to n times the resistance value of the digital-to-analog converter 321. Here, n indicates a natural number.

In the example of the weighted digital-to-analog converter 322 shown in FIG. 12, it may be appreciated that a resistor connected to the least significant bit (LSB) may have a value corresponding to ½ of a resistance value of the digital-to-analog converter 321, and a resistor connected to the most significant bit (MSB) may have a value corresponding to two times the resistance value of the digital-to-analog converter 321. This may be represented by Mathematical Equation 2.

$$V_{out} = -IR_f = -R_f\left(\frac{V_1}{2R} + \frac{V_2}{4R} + \frac{V_3}{8R} + \ldots \frac{V_n}{2^{n-2}R}\right)$$ [Mathematical Equation 2]

Therefore, the weighted digital-to-analog converting unit 320 may provide the first analog signal in which the weight is not reflected and the second analog signal in which the weight is reflected to first and second amplifiers 331 and 332, respectively. Outputs of the amplifying unit 330 may be input to both terminals of the piezoelectric element 100, respectively.

Figure 13:
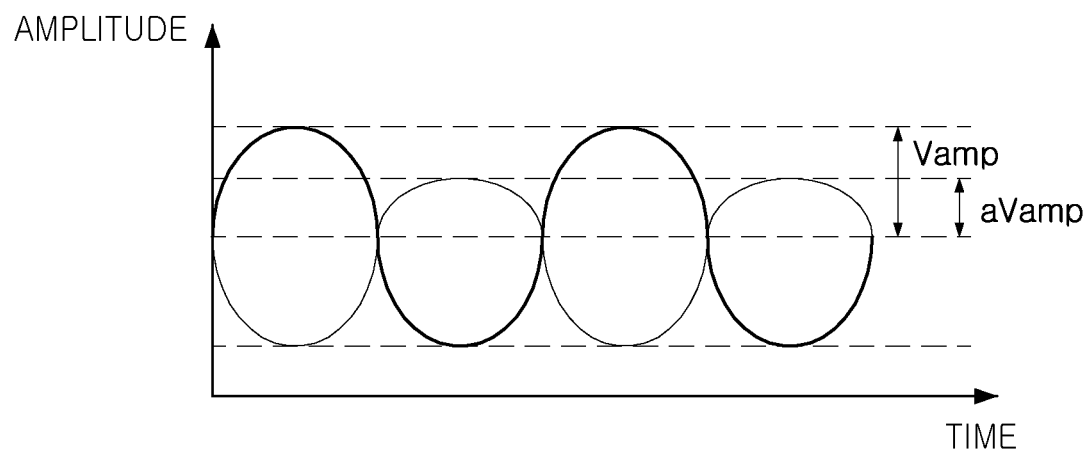
FIG. 13 is a graph illustrating an analog signal generated by reflecting a weight.

FIG. 13 is a graph illustrating an analog signal generated by reflecting a weight. In FIG. 3, a thick line denotes a signal generated from the analog signal output from the digital-to-analog converter 321, and a solid line denotes a signal generated from the analog signal output from the weighted digital-to-analog converter 322.

Figure 14:
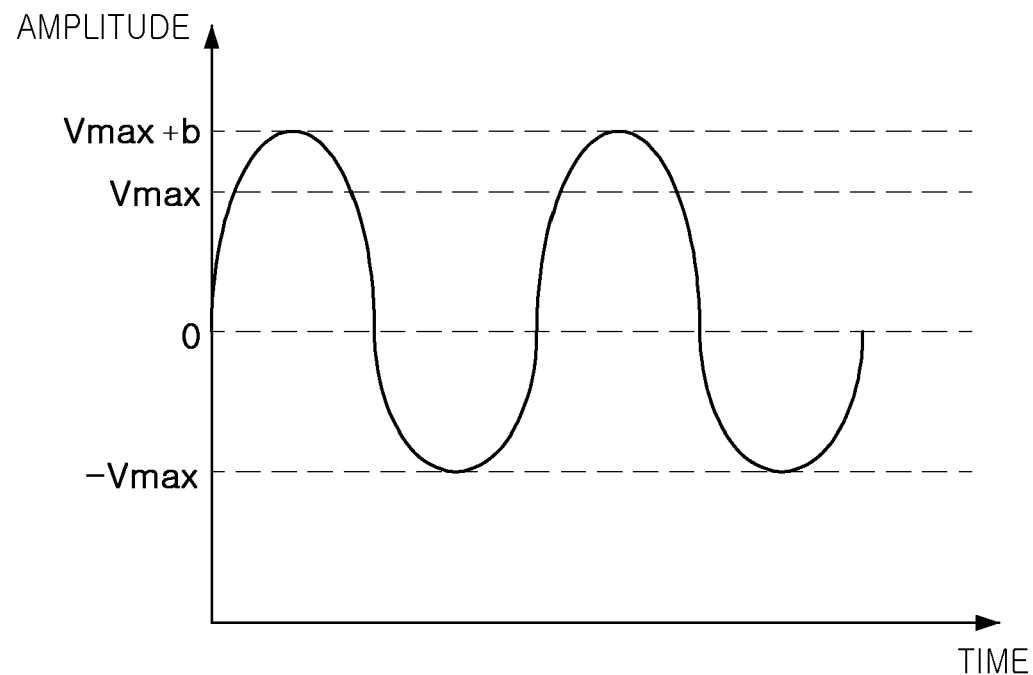
FIG. 14 is a graph illustrating a driving signal to a piezoelectric element by a pair of analog signals of FIG. 13.

The graph of FIG. 13 shows one symmetrical signal and one asymmetrical signal, similar to the graph of FIG. 7. Analog waveforms of FIG. 7 to which the weight is assigned by the waveform synthesizing unit may correspond to those of FIG. 13 to which the weight is assigned by the weighted digital-to-analog conversion. In addition, FIG. 14 shows a driving signal generated by a pair of waveforms.

Hereinabove, various examples of the piezoelectric element driving apparatus applying the driving signal using a symmetrical sine wave and an asymmetrical sine wave have been described with reference to FIGS. 5 through 14. The case in which the asymmetrical driving signal is applied using one asymmetrical signal and one symmetrical signal has been described above with reference to FIGS. 5 through 14. However, it is obvious that the asymmetrical driving signal may also be applied using a pair of asymmetrical signals in another exemplary embodiment of the present disclosure.

Applying this to an example described above with reference to FIG. 5, that is, an example in which the waveform synthesizing unit 210 applies the weight, the waveform synthesizing unit 210 may output a pair of asymmetrical digital signals. That is, the pair of digital signals may be an asymmetrical signal in which amplitudes of first and second polarities thereof are different from each other. FIG. 14 shows an example of these signals.

In an exemplary embodiment of the present disclosure, the waveform synthesizing unit 210 may apply a first asymmetrical coefficient to at least some of a plurality of digital values included in a preset lookup table to generate a first digital signal and apply a second asymmetrical coefficient to at least some of the plurality of digital value to generate a second digital signal.

In an exemplary embodiment of the present disclosure, the waveform synthesizing unit 210 may only apply the first asymmetrical coefficient to digital values corresponding to a first polarity in the first digital signal and only apply the second asymmetrical coefficient to digital values corresponding to a second polarity in the second digital signal.

In addition, a pair of asymmetrical analog signals may be generated using two weighted digital-to-analog converters, and the asymmetrical driving signal may be generated using the pair of asymmetrical analog signals.

Hereinabove, various examples of the piezoelectric element driving apparatus have been described. Hereinafter, a piezoelectric element driving method according to an exemplary embodiment of the present disclosure will be described. However, since the piezoelectric element driving method according to an exemplary embodiment of the present disclosure will be described by the piezoelectric element driving apparatus described above with reference to FIGS. 5 through 14, a description of contents that are the same as or correspond to the above-mentioned contents will be omitted in order to avoid an overlapped description.

Figure 15:
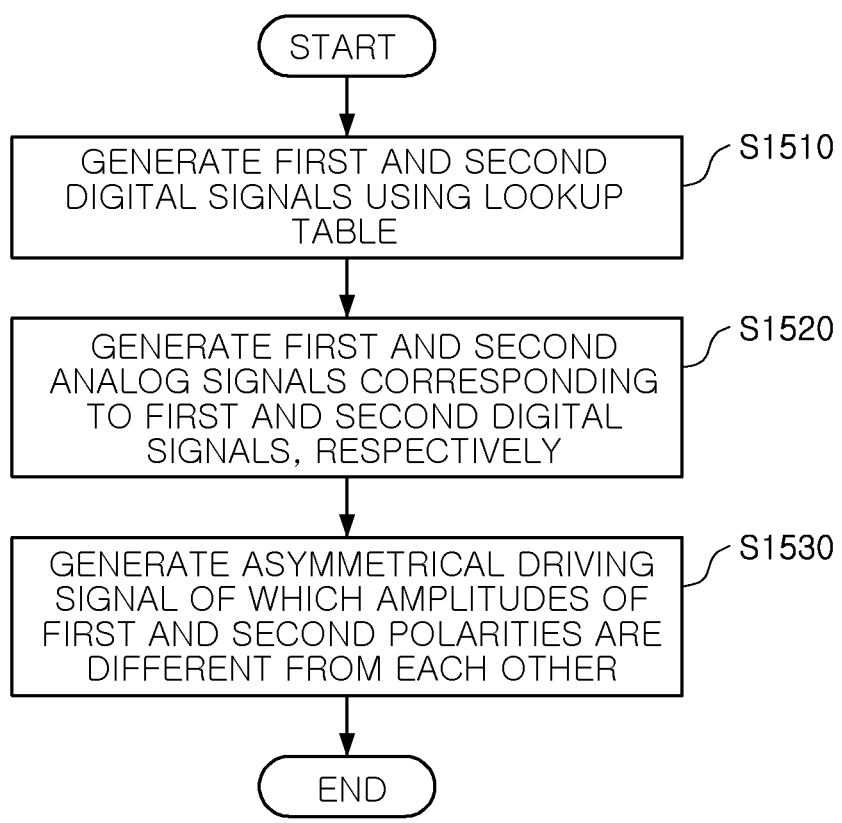
FIG. 15 is a flow chart showing a piezoelectric element driving method according to an exemplary embodiment of the present disclosure.

FIG. 15 is a flow chart illustrating a piezoelectric element driving method according to an exemplary embodiment of the present disclosure.

Referring to FIG. 15, the piezoelectric element driving apparatus may generate the first and second digital signals using the preset lookup table (S1510).

The, the piezoelectric element driving apparatus may generate the first and second analog signals corresponding to the first and second digital signals, respectively (S1520).

Then, the piezoelectric element driving apparatus may generate the asymmetrical driving signal of which the amplitudes of the first and second polarities are different from each other by amplifying the first and second analog signals (S1530).

Figure 16:
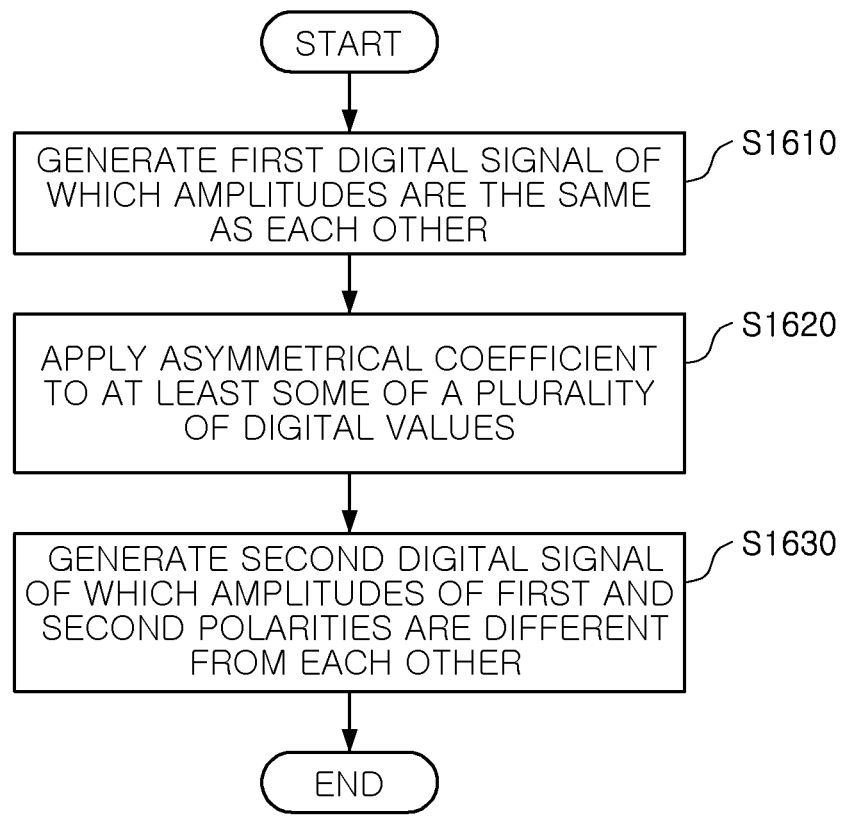
FIG. 16 is a flow chart describing an example of S1510 of the piezoelectric element driving method of FIG. 15.

FIG. 16 is a flow chart describing an example of S1510 of the piezoelectric element driving method of FIG. 15.

Referring to FIG. 16, the piezoelectric element driving apparatus may generate the first digital signal of which the amplitudes of the first and second polarities are the same as each other using the plurality of digital values included in the preset lookup table (S1610).

In addition, the piezoelectric element driving apparatus may apply the preset asymmetrical coefficient to at least some of the plurality of digital values (S1620) to generate the second digital signal of which the amplitudes of the first and second polarities are different from each other (S1630).

In an example of S1620, the piezoelectric element driving apparatus may only apply the asymmetrical coefficient to the digital values corresponding to the first polarity in the second digital signal.

Figure 17:
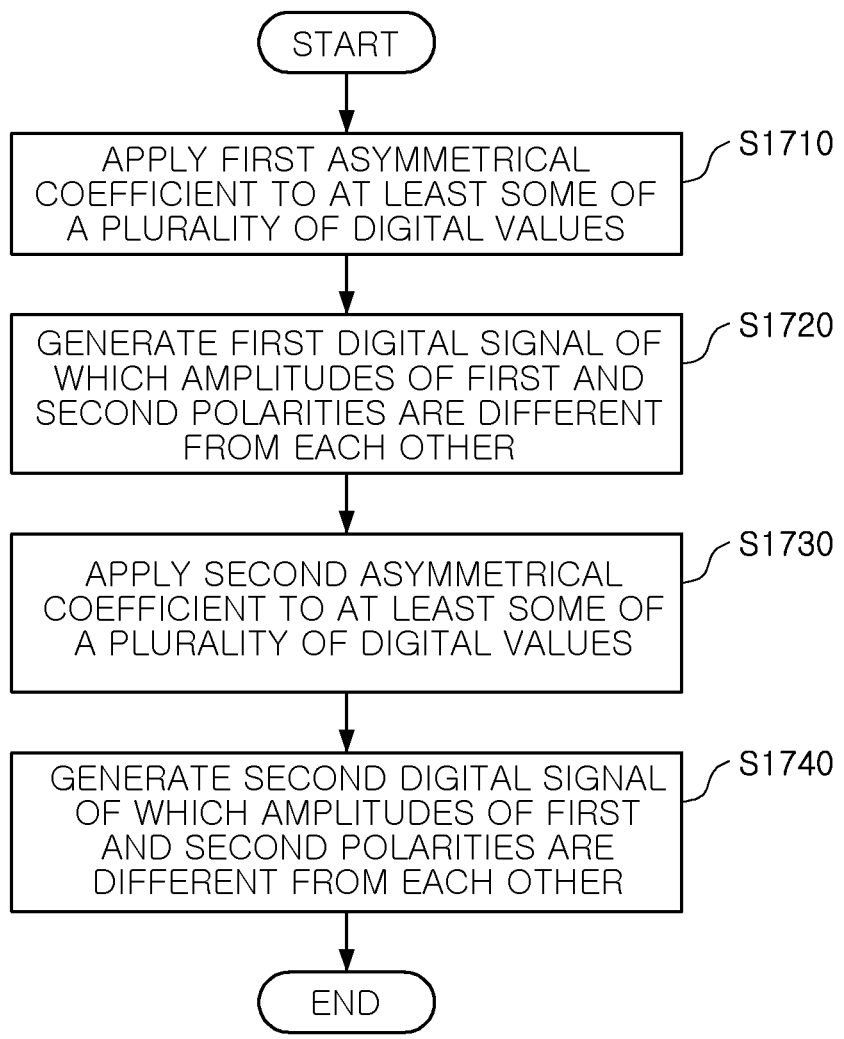
FIG. 17 is a flow chart describing another example of S1510 of the piezoelectric element driving method of FIG. 15.

FIG. 17 is a flow chart describing another example of S1510 of the piezoelectric element driving method of FIG. 15.

Referring to FIG. 17, the piezoelectric element driving apparatus may apply the first asymmetrical coefficient to at least some of the plurality of digital values included in the preset lookup table (S1710) to generate the first digital signal of which the amplitudes of the first and second polarities are different from each other (S1720).

In addition, the piezoelectric element driving apparatus may apply the second asymmetrical coefficient to at least some of the plurality of digital values (S1730) to generate the second digital signal of which the amplitudes of the first and second polarities are different from each other (S1740).

In an example of S1710, the piezoelectric element driving apparatus may only apply the first asymmetrical coefficient to the digital values corresponding to the first polarity in the first digital signal.

In an example of S1730, the piezoelectric element driving apparatus may only apply the second asymmetrical coefficient to the digital values corresponding to the second polarity in the second digital signal.

As set forth above, according to exemplary embodiments of the present disclosure, the piezoelectric element is driven using the asymmetrical driving signal, whereby the piezoelectric element driving apparatus may have a high output while protecting dielectric characteristics of the piezoelectric element.

While exemplary embodiments have been shown and described above, it will be apparent to those skilled in the art that modifications and variations could be made without departing from the spirit and scope of the present disclosure as defined by the appended claims.

What is claimed is:

1. A piezoelectric element driving apparatus applying a predetermined driving signal to a piezoelectric element to drive the piezoelectric element, comprising:
   a waveform synthesizing unit outputting first and second digital signals for generating a driving signal;
   a digital-to-analog converting unit outputting first and second analog signals corresponding to the first and second digital signals, respectively; and
   an amplifying unit amplifying the first and second analog signals and providing the amplified first and second analog signals to a piezoelectric element,
   wherein the waveform synthesizing unit generates the first and second digital signals using a plurality of digital values included in a preset lookup table, and
   wherein the driving signal is an asymmetrical waveform in which amplitudes of first and second polarities thereof are different from each other.

2. The piezoelectric element driving apparatus of claim 1, wherein the driving signal has positive and negative polarities as the first and second polarities, respectively, and is a waveform in which the amplitude of the first polarity thereof is larger than that of the second polarity thereof.

3. The piezoelectric element driving apparatus of claim 1, wherein the driving signal is a waveform in which maximum amplitudes of the first and second polarities thereof are different from each other.

4. The piezoelectric element driving apparatus of claim 1, wherein at least half of a period of the driving signal is a sine wave.

5. The piezoelectric element driving apparatus of claim 1, wherein the piezoelectric element is formed by stacking a plurality of piezoelectric layers.

6. The piezoelectric element driving apparatus of claim 1, wherein the piezoelectric element is formed by stacking eight to twenty four piezoelectric layers, each of which has a thickness of 15 or more to 100 µm or less.

7. The piezoelectric element driving apparatus of claim 1, wherein the piezoelectric element is formed by stacking twelve piezoelectric layers, and the amplitude of the positive polarity of the driving signal is smaller than 35V and the amplitude of the negative polarity thereof is larger than −25V.

8. The piezoelectric element driving apparatus of claim 1, wherein the piezoelectric element is formed by stacking twenty four piezoelectric layers, and the amplitude of the positive polarity of the driving signal is smaller than 18V and the amplitude of the negative polarity thereof is larger than −12V.

9. The piezoelectric element driving apparatus of claim 6, wherein the driving signal has positive and negative polarities as the first and second polarities, respectively, and the amplitude of the second polarity of the driving signal is larger than −25V.

10. The piezoelectric element driving apparatus of claim 6, wherein the driving signal has positive and negative polarities as the first and second polarities, respectively, and the amplitude of the first polarity of the driving signal is larger than 35V.

11. A piezoelectric element driving apparatus generating a pair of waveforms and applying the pair of waveforms to both terminals of a piezoelectric element, respectively, comprising:
  a waveform synthesizing unit outputting first and second digital signals for generating a driving signal;
  a digital-to-analog converting unit outputting first and second analog signals corresponding to the first and second digital signals, respectively; and
  an amplifying unit amplifying the first and second analog signals and providing the amplified first and second analog signals to a piezoelectric element,
  wherein the waveform synthesizing unit generates the first and second digital signals using a plurality of digital values included in a preset lookup table, and
  wherein the pair of waveforms include:
  a first symmetrical waveform of which amplitudes of first and second polarities are the same as each other; and
  a second asymmetrical waveform of which amplitudes of first and second polarities are different from each other.

12. The piezoelectric element driving apparatus of claim 11, wherein the second asymmetrical waveform has a phase difference of 180 degrees or less from the first symmetrical waveform.

13. The piezoelectric element driving apparatus of claim 11, wherein it applies the first symmetrical waveform to a positive terminal of the piezoelectric element and applies the second asymmetrical waveform to a negative terminal of the piezoelectric element.

14. The piezoelectric element driving apparatus of claim 13, wherein the second asymmetrical waveform has positive and negative polarities as the first and second polarities, respectively, and the amplitude of the first polarity of the second waveform is smaller than that of the second polarity thereof.

15. A piezoelectric element driving apparatus generating a pair of sine waves and applying the pair of sine waves to both terminals of a piezoelectric element, respectively, comprising:
  a waveform synthesizing unit outputting first and second digital signals for generating a driving signal;
  a digital-to-analog converting unit outputting first and second analog signals corresponding to the first and second digital signals, respectively;
  an amplifying unit amplifying the first and second analog signals and providing the amplified first and second analog signals to a piezoelectric element,
  wherein the waveform synthesizing unit generates the first and second digital signals using a plurality of digital values included in a preset lookup table, and
  wherein the pair of sine waves include:
  a first asymmetrical sine wave of which amplitudes of first and second polarities are different from each other; and
  a second asymmetrical sine wave of which amplitudes of first and second polarities are different from each other.

16. The piezoelectric element driving apparatus of claim 15, wherein the second asymmetrical sine wave has a phase difference of 180 degrees or less from the first asymmetrical sine wave.

17. The piezoelectric element driving apparatus of claim 15, wherein it applies the first asymmetrical sine wave to a positive terminal of the piezoelectric element and applies the second asymmetrical sine wave to a negative terminal of the piezoelectric element.

18. The piezoelectric element driving apparatus of claim 15, wherein the first asymmetrical sine wave has positive and negative polarities as the first and second polarities, respectively, and the amplitude of the first polarity of the first asymmetrical sine wave is larger than that of the second polarity thereof.

19. The piezoelectric element driving apparatus of claim 15, wherein the second asymmetrical sine wave has positive and negative polarities as the first and second polarities, respectively, and the amplitude of the first polarity of the second asymmetrical sine wave is smaller than that of the second polarity thereof.

20. A piezoelectric element driving apparatus comprising:
  a waveform synthesizing unit outputting first and second digital signals for generating a driving signal;
  a digital-to-analog converting unit outputting first and second analog signals corresponding to the first and second digital signals, respectively; and
  an amplifying unit amplifying the first and second analog signals and providing the amplified first and second analog signals to a piezoelectric element,
  wherein the waveform synthesizing unit generates the first and second digital signals using a plurality of digital values included in a preset lookup table, and
  wherein the driving signal is an asymmetrical sine wave in which amplitudes of first and second polarities thereof are different from each other.

21. The piezoelectric element driving apparatus of claim 20, wherein the driving signal corresponds to a value obtained by subtracting the second analog signal output from the amplifying unit from the first analog signal output from the amplifying unit.

22. The piezoelectric element driving apparatus of claim 20, wherein the second digital signal has a phase difference of 180 degrees or less from the first digital signal.

23. The piezoelectric element driving apparatus of claim 20, wherein the first digital signal is a symmetrical signal in which amplitudes of first and second polarities thereof are the same as each other, and the second digital signal is an asymmetrical signal in which amplitudes of first and second polarities thereof are different from each other.

24. A piezoelectric element driving apparatus comprising:
a waveform synthesizing unit outputting first and second digital signals for generating a driving signal;
a digital-to-analog converting unit outputting first and second analog signals corresponding to the first and second digital signals, respectively; and
an amplifying unit amplifying the first and second analog signals and providing the amplified first and second analog signals to a piezoelectric element,
wherein the driving signal is an asymmetrical sine wave in which amplitudes of first and second polarities thereof are different from each other,
wherein the first digital signal is a symmetrical signal in which amplitudes of first and second polarities thereof are the same as each other, and the second digital signal is an asymmetrical signal in which amplitudes of first and second polarities thereof are different from each other, and
wherein the waveform synthesizing unit generates the first digital signal using a plurality of digital values included in a preset lookup table and applies a preset asymmetrical coefficient to at least some of the plurality of digital values to generate the second digital signal.

25. The piezoelectric element driving apparatus of claim 24, wherein the waveform synthesizing unit only applies the asymmetrical coefficient to digital values corresponding to the first polarity in the second digital signal.

26. The piezoelectric element driving apparatus of claim 20, wherein the first digital signal is an asymmetrical signal in which amplitudes of first and second polarities thereof are different from each other, and the second digital signal is an asymmetrical signal in which amplitudes of first and second polarities thereof are different from each other.

27. A piezoelectric element driving apparatus comprising:
a waveform synthesizing unit outputting first and second digital signals for generating a driving signal;
a digital-to-analog converting unit outputting first and second analog signals corresponding to the first and second digital signals, respectively; and
an amplifying unit amplifying the first and second analog signals and providing the amplified first and second analog signals to a piezoelectric element,
wherein the driving signal is an asymmetrical sine wave in which amplitudes of first and second polarities thereof are different from each other,
wherein the first digital signal is an asymmetrical signal in which amplitudes of first and second polarities thereof are different from each other, and the second digital signal is an asymmetrical signal in which amplitudes of first and second polarities thereof are different from each other, and
wherein the waveform synthesizing unit applies a first asymmetrical coefficient to at least some of a plurality of digital values included in a preset lookup table to generate the first digital signal and applies a second asymmetrical coefficient to at least some of the plurality of digital values included in a preset lookup table to generate the second digital signal.

28. The piezoelectric element driving apparatus of claim 27, wherein the waveform synthesizing unit only applies the first asymmetrical coefficient to digital values corresponding to the first polarity in the first digital signal and only applies the second asymmetrical coefficient to digital values corresponding to the second polarity in the second digital signal.

29. A piezoelectric element driving apparatus comprising:
a waveform synthesizing unit outputting first and second digital signals for generating a driving signal;
a digital-to-analog converting unit including a weighted digital-to-analog converter assigning an asymmetrical coefficient to at least one of the first and second digital signals to generate an asymmetrical sine wave and outputting first and second analog signals corresponding to the first and second digital signals, respectively; and
an amplifying unit amplifying the first and second analog signals and providing the amplified first and second analog signals to a piezoelectric element,
wherein the driving signal is an asymmetrical sine wave in which amplitudes of first and second polarities thereof are different from each other, and
wherein the weighted digital-to-analog converter includes a weighted resistor corresponding to the asymmetrical coefficient.

30. A piezoelectric element driving apparatus comprising:
a waveform synthesizing unit outputting first and second digital signals for generating a driving signal;
a digital-to-analog converting unit including a weighted digital-to-analog converter assigning an asymmetrical coefficient to at least one of the first and second digital signals to generate an asymmetrical sine wave and outputting first and second analog signals corresponding to the first and second digital signals, respectively; and
an amplifying unit amplifying the first and second analog signals and providing the amplified first and second analog signals to a piezoelectric element,
wherein the driving signal is an asymmetrical sine wave in which amplitudes of first and second polarities thereof are different from each other, and
wherein in the weighted digital-to-analog converter, a resistor connected to the least significant bit (LSB) has a value corresponding to 1/n of a resistance value of a digital-to-analog converter, and a resistor connected to the most significant bit (MSB) has a value corresponding to n times the resistance value of the digital-to-analog converter.

31. A piezoelectric system comprising:
a piezoelectric element driving apparatus including a waveform synthesizing unit outputting first and second digital signals for generating a driving signal, a digital-to-analog converting unit outputting first and second analog signals corresponding to the first and second digital signals, respectively, an amplifying unit amplifying the first and second analog signals and providing the amplified first and second analog signals to a piezoelectric element, and the waveform synthesizing unit generating the first and second digital signals using a plurality of digital values included in a preset lookup table, the piezoelectric element driving apparatus outputting a first asymmetrical waveform of which amplitudes of first and second polarities are different from each other and a second asymmetrical waveform of which amplitudes of first and second polarities are different from each other; and a piezoelectric element receiving the first asymmetrical waveform through a first terminal thereof and receiving the second asymmetrical waveform through a second terminal thereof.

32. A piezoelectric element driving method comprising: generating first and second digital signals using a preset lookup table; generating first and second analog signals corresponding to the first and second digital signals, respectively; and generating an asymmetrical driving signal of which amplitudes of first and second polarities are different from each other by amplifying the first and second analog signals.

33. The piezoelectric element driving method of claim 32, wherein the generating of the first and second digital signals includes: generating the first digital signal of which amplitudes of first and second polarities are the same as each other using a plurality of digital values included in the preset lookup table; and applying a preset asymmetrical coefficient to at least some of the plurality of digital values to generate the second digital signal of which amplitudes of first and second polarities are different from each other.

34. The piezoelectric element driving method of claim 33, wherein the generating of the first and second digital signals includes only applying the asymmetrical coefficient to digital values corresponding to the first polarity in the second digital signal.

35. The piezoelectric element driving method of claim 32, wherein the generating of the first and second digital signals includes: applying a first asymmetrical coefficient to at least some of a plurality of digital values included in the preset lookup table to generate the first digital signal of which amplitudes of first and second polarities are different from each other; and applying a second asymmetrical coefficient to at least some of the plurality of digital values to generate the second digital signal of which amplitudes of first and second polarities are different from each other.

36. The piezoelectric element driving method of claim 35, wherein the generating of the first digital signal includes only applying the first asymmetrical coefficient to digital values corresponding to the first polarity in the first digital signal.

37. The piezoelectric element driving method of claim 36, wherein the generating of the second digital signal includes only applying the second asymmetrical coefficient to digital values corresponding to the second polarity in the second digital signal.

* * * * *